United States Patent
Fukui et al.

(10) Patent No.: US 7,456,967 B2
(45) Date of Patent: Nov. 25, 2008

(54) MARK POSITION DETECTION APPARATUS

(75) Inventors: Tatsuo Fukui, Yokohama (JP); Takeshi Endo, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/516,542

(22) Filed: Sep. 7, 2006

(65) Prior Publication Data

US 2007/0002323 A1    Jan. 4, 2007

Related U.S. Application Data

(63) Continuation of application No. 10/782,814, filed on Feb. 23, 2004, now abandoned.

(30) Foreign Application Priority Data

Feb. 28, 2003  (JP) ............................. 2003-054058
Jul. 4, 2003    (JP) ............................. 2003-192283

(51) Int. Cl.
*G01B 11/00* (2006.01)

(52) U.S. Cl. .................................................. 356/401

(58) Field of Classification Search ................ 356/153, 356/138–139, 399–401
See application file for complete search history.

(56) References Cited

U.S. PATENT DOCUMENTS 4,929,083 A * 5/1990 Brunner ..................... 356/400
5,585,923 A * 12/1996 Nose et al. ................. 356/490
5,680,200 A   10/1997 Sugaya et al.
5,754,299 A    5/1998 Sugaya et al.
5,766,809 A    6/1998 Bae
6,885,450 B2   4/2005 Fukui
2002/0003626 A1 1/2002 Fukui
2002/0060793 A1 5/2002 Fukui
2003/0103196 A1* 6/2003 Hirukawa ................... 355/55

FOREIGN PATENT DOCUMENTS

| JP | A 2000-77295 | 3/2000 |
| JP | A 2000-349014 | 12/2000 |
| JP | A 2002-164266 | 6/2002 |
| JP | 2004-158555 | 6/2004 |

* cited by examiner

*Primary Examiner*—Tarifur R. Chowdhury
*Assistant Examiner*—Isiaka O Akanbi
(74) *Attorney, Agent, or Firm*—Oliff & Berridge, PLC

(57) ABSTRACT

A mark position detection apparatus has an illumination optical system for illuminating a measurement mark with illumination light and an imaging optical system for converging light reflected from the measurement mark to form an image of the measurement mark on an image pickup apparatus. The mark position detection apparatus measures a positional displacement of the measurement mark by processing an image signal obtained by the image pickup apparatus. The mark position detection apparatus has an optical element provided in the illumination optical system for compensating a difference in asymmetry of the image signal that depends on the wavelength of the illumination light.

9 Claims, 12 Drawing Sheets

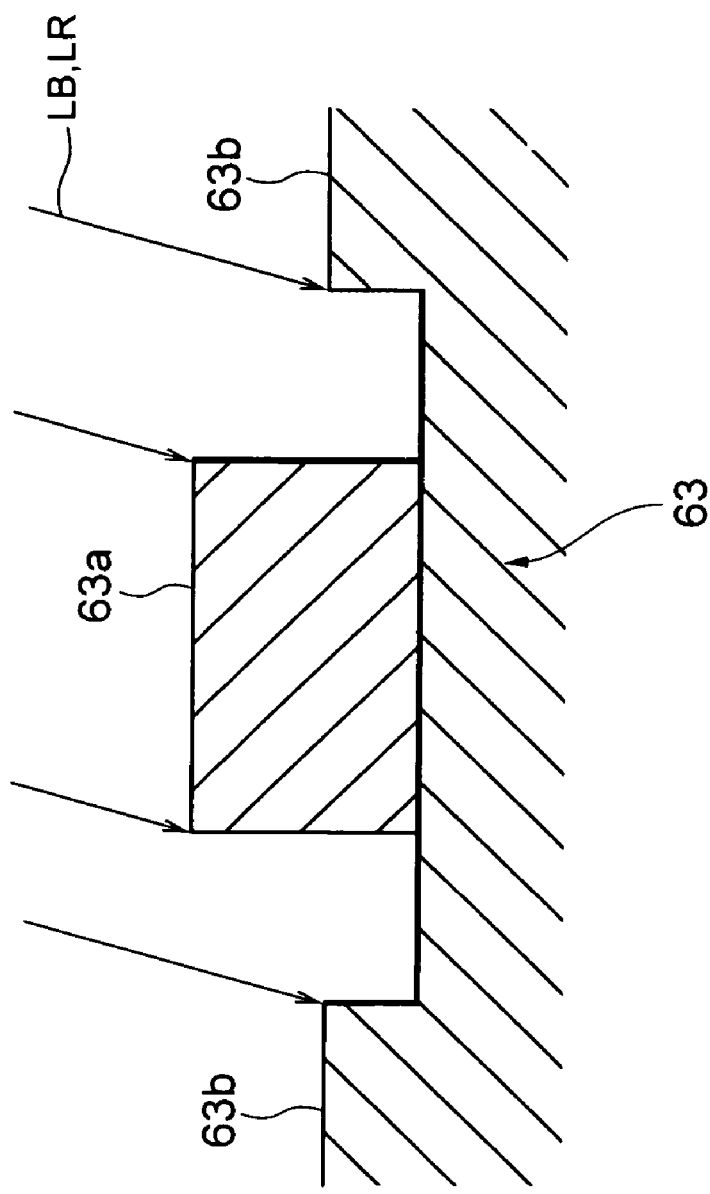
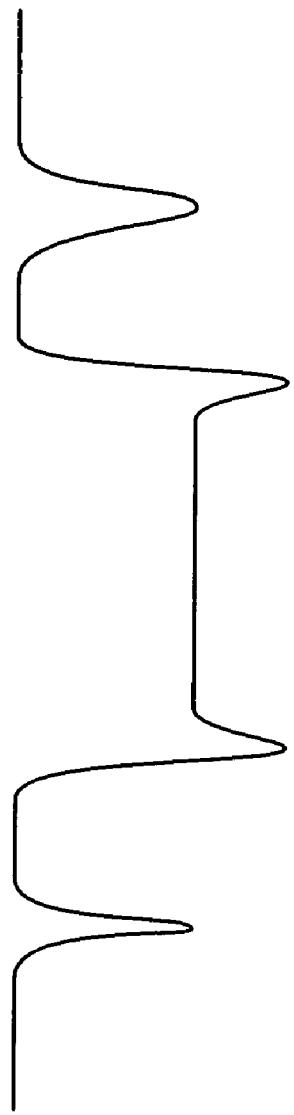
FIG. 3A
FIG. 3B

Q VALUE = $\Delta I / I_0 \times 100$

MARK POSITION DETECTION APPARATUS

CROSS-REFERENCE TO RELATED APPLICATION

This is a continuation application of U.S. application Ser. No. 10/782,814 filed on Feb. 23, 2004, which claims the benefit of Japanese Patent applications No. 2003-054058 and No. 2003-192283, the disclosures of which are hereby incorporated by reference in their entirety.

BACKGROUND OF THE INVENTION

1. Field of the Invention

The present invention relates to a mark position detection apparatus for detecting the position of a overlay mark or an alignment mark provided on a substrate to be detected such as a semiconductor wafer or the like.

2. Related Background Art

In the conventional semiconductor manufacturing process, it is necessary to measure the amount of positional displacement between a resist pattern formed by a photolithography process and an underlying pattern. Overlay measuring apparatuses for measuring an amount of displacement in superposition have been proposed (for example in Japanese Patent Application Laid-Open No. 2000-77295).

The apparatus disclosed in Japanese Patent Application Laid-Open No. 2000-77295 measures the amount of displacement in overlay by illuminating a measurement mark with illumination light, focusing light reflected from the measurement mark by an imaging optical system to form an image, picking up the image by an image pickup apparatus such as a CCD camera, and processing the image. In this apparatus, the wavelength range of the illumination light is so wide as to include visible light and near-infrared light in order to obtain stable reflection light intensity for various types of measurement mark structures.

In the case that an overlay error is measured optically, optical aberrations in the measurement optical system (that is, an illumination optical system for illuminating a measurement mark with illumination light and an imaging optical system for collecting and focusing reflected light from the measurement mark) are inevitable. If there are such aberrations, especially aberrations which are not rotationally symmetric about the optical axis, in the measurement field of view, detection of a measurement mark position will contain errors, so that the obtained overlay measurement value contains a measurement error as a TIS (Tool Induced Shift).

In view of the above, it has been proposed to adjust the position of an illumination aperture stop, an imaging aperture stop or an objective lens included in the measurement optical system of a overlay measuring apparatus before measuring an overlay error using that measuring apparatus (for example in Japanese Patent Application Laid-Open No. 2000-77295).

However, in the prior art as described above, the image position of the illumination aperture stop at the virtual pupil position of the objective lens in the illumination optical system varies depending on the wavelength of the illumination light due to manufacturing errors generated upon mounting the optical parts of the measuring apparatus. The inclination of the principal ray of the illumination light flux (which inclination will be referred to as "illumination telecentricity" hereinafter) varies depending on the color (i.e. the wavelength) and sometimes causes the measurement error TIS depending on the spectral characteristics of measurement marks. In addition, in the imaging optical system also, the image position of the virtual pupil at the position of the imaging aperture stop in the imaging optical system varies depending on the wavelength of the illumination light due of manufacturing errors generated upon mounting the optical parts. This means that diffracted light from the measurement mark is sometimes eclipsed asymmetrically depending on the wavelength range of the reflected light. This can cause the measurement error TIS depending on the spectral characteristics of measurement marks.

SUMMARY OF THE INVENTION

The present invention has been made in view of the above-described problems. An object of a first aspect of the present invention is to provide a mark position detection apparatus with which measurement errors TIS can be reduced irrespective of the color (i.e. the wavelength) of illumination light and a mark position can be detected with high accuracy.

In order to attain the above object, the first aspect of present invention provides a mark position detection apparatus which comprises:

an illumination optical system for illuminating a measurement mark with illumination light; and an imaging optical system for converging light reflected from the measurement mark to form an image of the measurement mark on an image pickup apparatus; and which measures a positional displacement of the measurement mark by processing an image signal obtained by the image pickup apparatus;

wherein an optical element for compensating a difference in asymmetry of the image signal that depends on the wavelength of the illumination light, is provided in the illumination optical system.

In the mark position detection apparatus according to the first aspect of the present invention, it is preferable that the optical element is provided in a parallel light flux portion of the illumination optical system.

According to the first aspect of the present invention, there is also provided a mark position detection apparatus which comprises:

an illumination optical system for illuminating a measurement mark with illumination light; and an imaging optical system for converging light reflected from the measurement mark to form an image of the measurement mark on an image pickup apparatus; and which measures a positional displacement of the measurement mark by processing an image signal obtained by the image pickup apparatus;

wherein an optical element for compensating a difference in asymmetry of the image signal that depends on the wavelength of the illumination light, is provided in a parallel light flux portion of the imaging optical system.

In the mark position detection apparatus according to the first aspect of the present invention, it is preferable that the optical element comprises a plane parallel plate.

In the mark position detection apparatus according to the first aspect of the present invention, it is preferable that the optical element comprises a plane parallel plate provided with a tilting mechanism.

According to the first aspect of the present invention, there is also provided a mark position detection apparatus which comprises:

an illumination optical system for illuminating a measurement mark with illumination light; and an imaging optical system for converging light reflected from the measurement mark to form an image of the measurement mark on an image pickup apparatus, and which measures a positional displacement of the measurement mark by processing an image signal obtained by the image pickup apparatus;

wherein a first optical element is provided in the illumination optical system and a second optical element is provided in a parallel light flux portion of the imaging optical system, thereby compensating a difference in asymmetry of the image signal that depends on the wavelength of the illumination light.

In the mark position detection apparatus according to the first aspect of the present invention, it is preferable that each of the first optical element and the second optical element comprises a plane parallel plate.

In the mark position detection apparatus according to the first aspect of the present invention, it is preferable that each of the first optical element and the second optical element comprises a plane parallel plate provided with a tilting mechanism.

In the mark position detection apparatus according to the first aspect of the present invention, it is preferable that the first optical element or the second optical element comprises a plane parallel plate provided with a tilting mechanism.

An object of a second aspect of the present invention is to propose a simple method for adjusting a microscope apparatus. In order to attain this object, the present invention provides a method for adjusting a microscope apparatus having an illumination optical system for illuminating a measurement mark with illumination light and an imaging optical system for converging light reflected from the measurement mark to form an image of the measurement mark on an image pickup apparatus, the microscope apparatus detecting a positional displacement of the measurement mark by processing an image signal obtained by the image pickup apparatus, the method comprising:

providing an optical element for shifting an light axis of the illumination light at a position in the vicinity of a position of an illumination aperture stop or a position conjugate with the position of the illumination aperture stop; and adjusting the optical element in such a way that illumination wavelength dependency of the image signal becomes minimum.

In the method for adjusting a microscope apparatus according to the second aspect of the present invention, it is preferable that the measurement mark comprise linear grooves having a regular width that are arranged periodically with regular intervals.

In the method for adjusting a microscope apparatus according to the second aspect of the present invention, it is preferable that the measurement mark comprises at least two small rectangular indents having the common center, and the depths of the two rectangular indents are different from each other.

In the method for adjusting a microscope apparatus according to the second aspect of the present invention, it is preferable that the measurement mark comprises an indented portion having a depth equal to two to six times the focal length of the microscope apparatus.

BRIEF DESCRIPTION OF THE DRAWINGS

FIGS. 3A and 3B are diagrams related to a measurement mark profile under a state in which an illumination light flux is inclined, wherein FIG. 3A shows a cross section of the measurement mark in which difference in the incidence direction due to difference in the color (or the wavelength) of the incident light is schematically shown and FIG. 3B shows asymmetry of a waveform obtained from the measurement mark.

FIGS. 4A and 4B schematically show an effect of a plane parallel plate, wherein FIG. 4A shows light paths of blue and red light fluxes under a state in which the plane parallel plate is not inclined and FIG. 4B shows light paths of blue and red light fluxes under a state in which the plane parallel plate is inclined.

FIGS. 6A and 6B illustrate asymmetry of a measurement mark profile depending on the color (or the wavelength) of light reflected from the measurement mark, wherein FIG. 6A shows a cross section of the measurement mark in which difference in the color (or the wavelength) of the reflected light is schematically shown and FIG. 6B shows asymmetry of a waveform obtained from the measurement mark.

FIGS. 7A to 7C show an example of a mark used upon measurement of a Q value characteristics curve, wherein FIG. 7A is a plan view showing an L/S mark, FIG. 7B is a cross sectional view of the L/S mark, and FIG. 7C shows an image signal intensity profile of the L/S mark.

FIGS. 8A to 8C show examples of Q value characteristics curves, wherein FIG. 8A shows a Q value characteristics curve of an imaging aperture stop, FIG. 8B shows a Q value characteristics of a second objective lens, and FIG. 8C shows a synthesized Q value characteristics curve of the imaging aperture stop and the second objective lens.

FIGS. 9A to 9C relate to a measurement mark used in the adjustment process according to the second embodiment of the present invention, wherein FIG. 9A is a plan view, FIG. 9B is a cross sectional view taken along line A-A in FIG. 9A and FIG. 9C shows an example of a processed image signal obtained from the measurement mark.

FIGS. 10A to 10C relate to a measurement mark used in the adjustment process according to the third embodiment of the present invention, wherein FIG. 10A is a plan view, FIG. 10B is a cross sectional view taken along line A-A in FIG. 10A and FIG. 10C shows an example of a processed image signal obtained from the measurement mark.

FIGS. 11A and 11B relate to a modification of the measurement mark that can be used in the second or third embodiment of the present invention, wherein FIG. 11A is a plan view and FIG. 11B is a cross sectional view.

FIGS. 12A to 12C relate to a measurement mark used in the adjustment process according to the fourth embodiment of the present invention, wherein FIG. 12A is a plan view, FIG. 12B is a cross sectional view taken along line A-A in FIG. 12A and FIG. 12C shows an example of a processed image signal obtained from the measurement mark.

DETAILED DESCRIPTION OF THE PREFERRED EMBODIMENTS

First Embodiment

Figure 1:
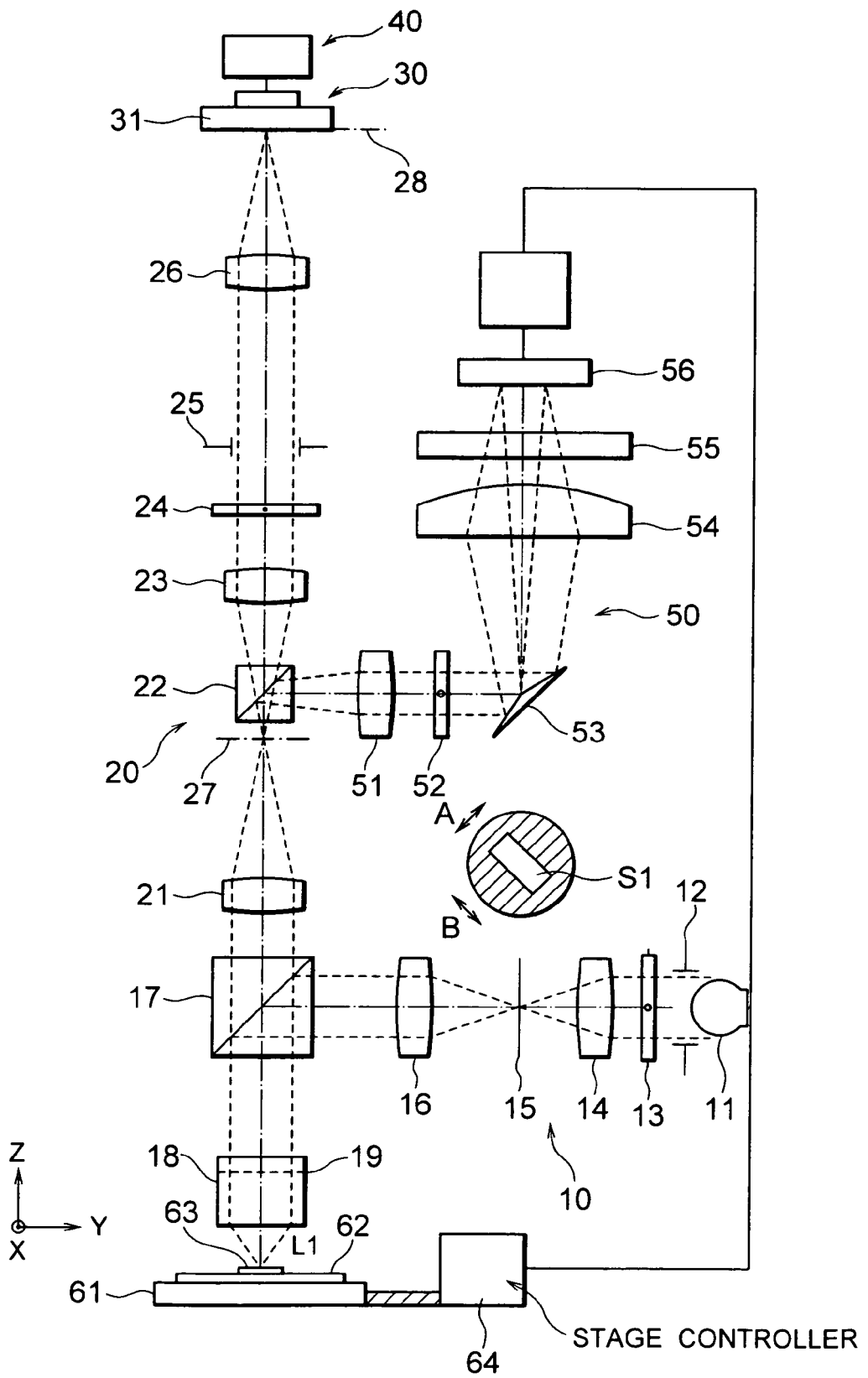
FIG. 1 is a diagram schematically showing the structure of a mark position detection apparatus according to the first aspect of the present invention.
Figure 2:
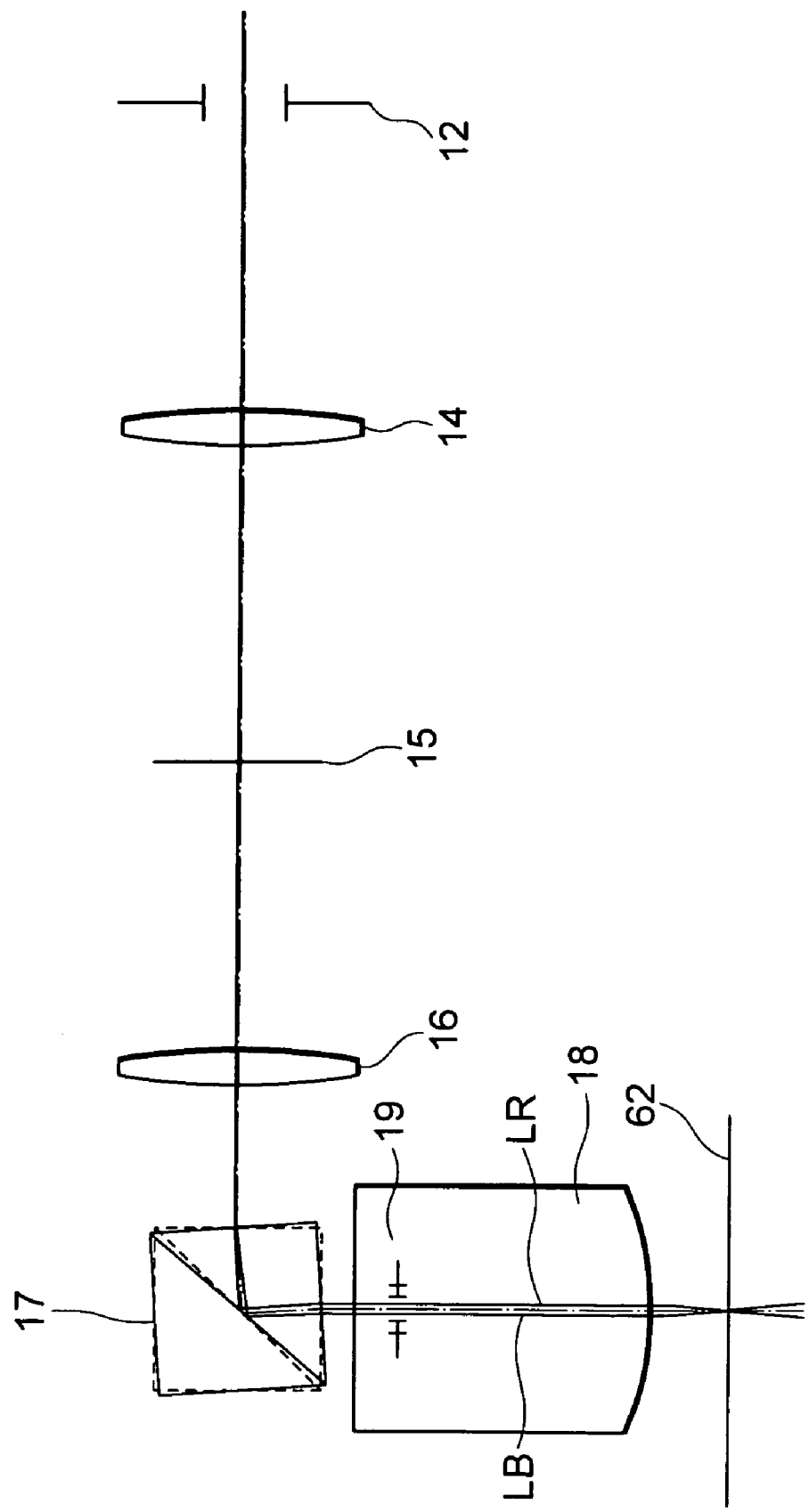
FIG. 2 is a diagram showing an example of illumination telecentricity displacement caused by a tilt error of an optical element in an illumination optical system in the mark position detection apparatus according to the first aspect of the present invention.
Figure 4A:
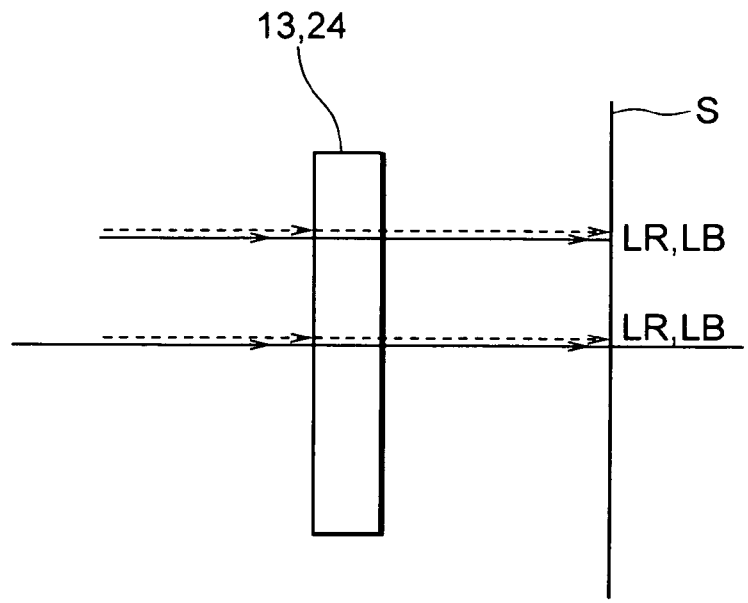
Figure 4B:
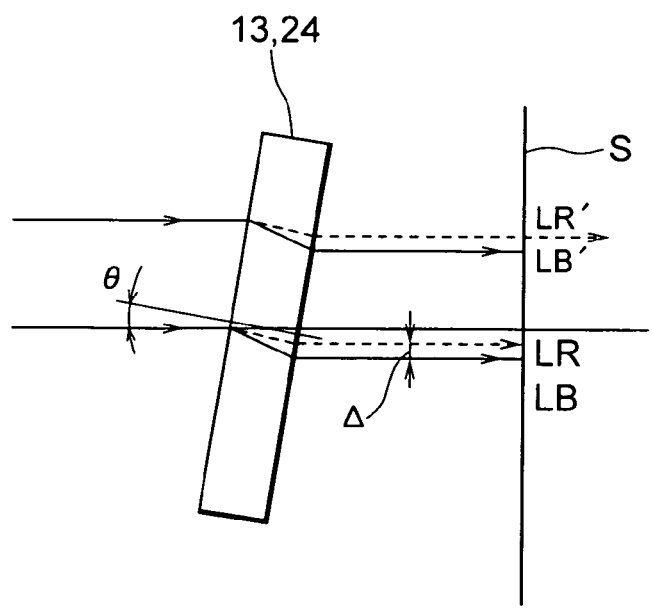
Figure 5:
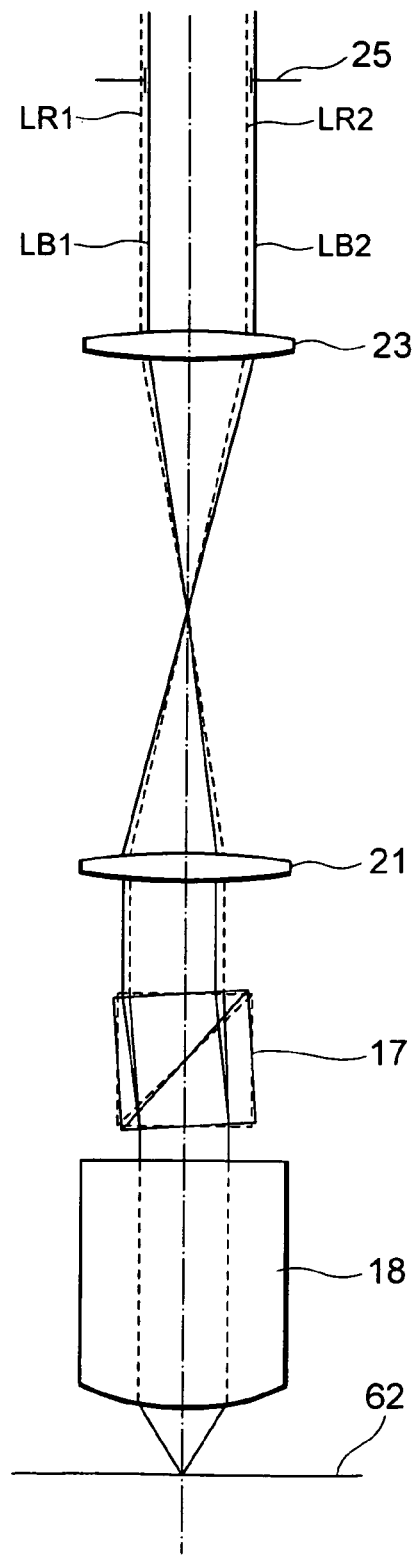
FIG. 5 shows an example of color dependent asymmetry (or wavelength dependent asymmetry) of imaging due to a tilt error of an optical element in an imaging optical system in the mark position detection apparatus according to the first aspect of the present invention.
Figure 6A:
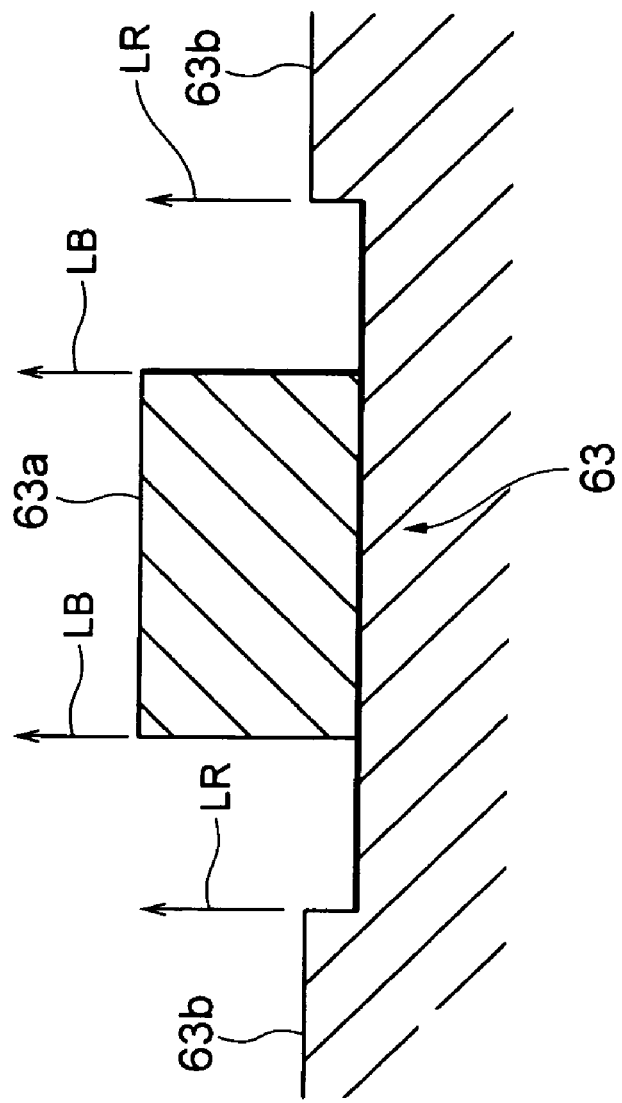
Figure 6B:
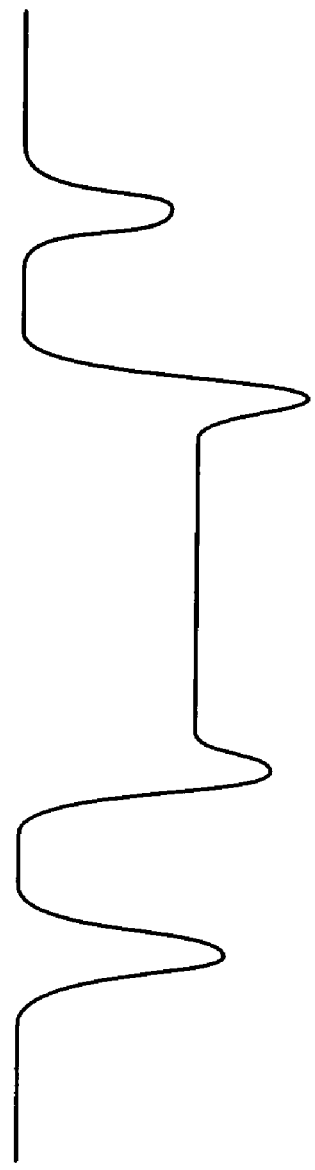
Figure 7A:
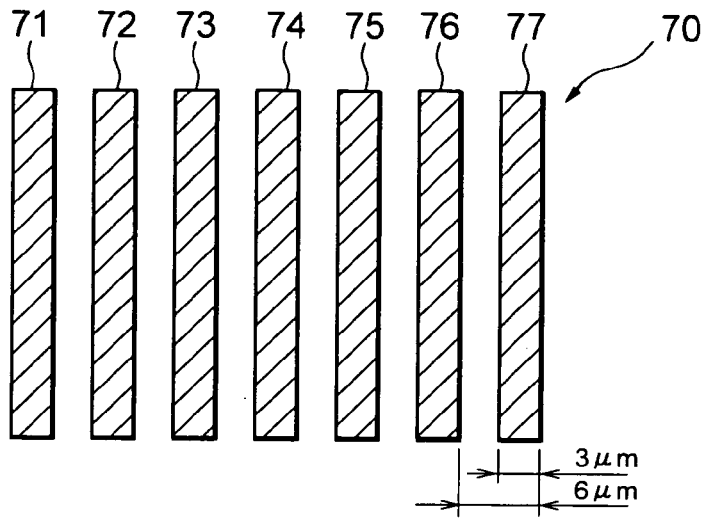
Figure 7B:
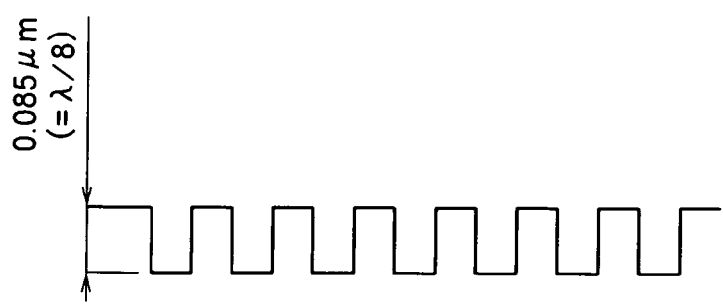
Figure 7C:
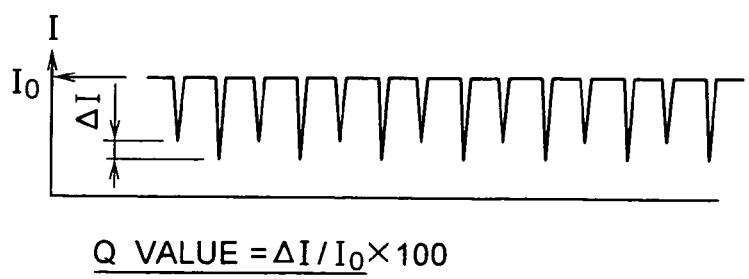
Figure 8A:
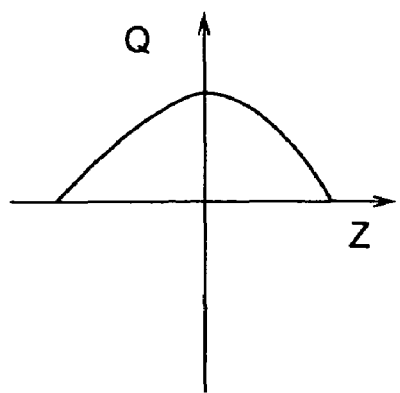
Figure 8B:
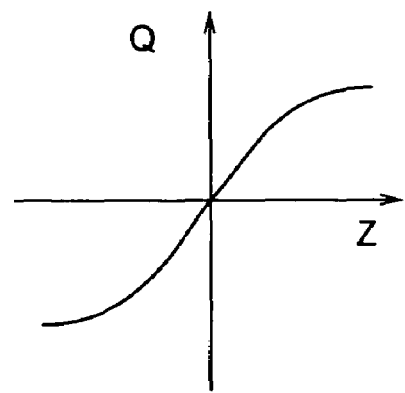
Figure 8C:
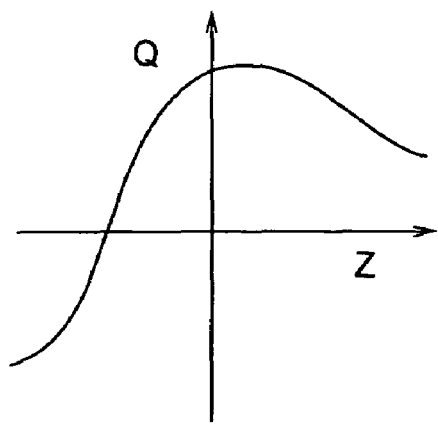

In the following, a first embodiment of the present invention will be described with reference to drawings. FIG. 1 is a diagram schematically showing the structure of a mark position detection apparatus according to the first embodiment of the present invention. FIG. 2 is a diagram showing an example of illumination telecentricity displacement caused by a tilt error of an optical element in an illumination optical system in the mark position detection apparatus according to the first embodiment. FIGS. 3A and 3B are diagrams related to a measurement mark profile under a state in which the illumination light flux is inclined, wherein FIG. 3A shows a cross section of the measurement mark in which difference in the incidence direction due to difference in the color (or the wavelength) of the incident light is schematically shown and FIG. 3B shows asymmetry of a waveform obtained from the measurement mark. FIGS. 4A and 4B schematically show an effect of a plane parallel plate, wherein FIG. 4A shows light paths of blue and red light fluxes under a state in which the plane parallel plate is not inclined and FIG. 4B shows light paths of blue and red light fluxes under a state in which the plane parallel plate is inclined. FIG. 5 shows an example of color dependent asymmetry (or wavelength dependent asymmetry) of imaging due to a tilt error of an optical element in an imaging optical system in the mark position detection apparatus according to the present first embodiment. FIGS. 6A and 6B illustrate asymmetry of a measurement mark profile depending on the color (or the wavelength) of light reflected from the measurement mark, wherein FIG. 6A shows a cross section of the measurement mark in which difference in the color (or the wavelength) of the reflected light is schematically shown and FIG. 6B shows asymmetry of a waveform obtained from the measurement mark. FIGS. 7A to 7C show an example of a mark used upon measurement of Q value characteristics curve, wherein FIG. 7A is a plan view showing an L/S mark, FIG. 7B is a cross sectional view of the L/S mark, and FIG. 7C shows an image signal intensity profile of the L/S mark. FIGS. 8A to 8C show examples of Q value characteristics curves, wherein FIG. 8A shows a Q value characteristics curve of an imaging aperture stop, FIG. 8B shows a Q characteristics value of a second objective lens, and FIG. 8C shows a synthesized Q value characteristics curve of the imaging aperture stop and the second objective lens.

In FIG. 1, the X axis is defined in the direction perpendicular to the plane of the drawing sheet, the Y axis is defined in the horizontal direction in the drawing sheet, and the Z axis is defined in the vertical direction in the drawing sheet.

The mark position detection apparatus according to this embodiment is provided with a stage 61, an illumination optical system 10 for illuminating a measurement mark disposed on the stage 61, an imaging optical system 20 for collecting and focusing light reflected from the measurement mark to form an image, an image pickup apparatus 30 for picking up the image formed by the imaging optical system 20, an image processing apparatus 40 for processing an image signal of the picked up image obtained by the image pickup apparatus 30 and an auto focusing (AF) apparatus 50 for focusing an image of the measurement mark on the image pickup apparatus 30.

The mark position detection apparatus shown in FIG. 1 is intended to measure superposition displacement (or misalignment) of a resist mark in a measurement mark 63 formed on a wafer 62. At the time of measurement, the wafer 62 is placed on the stage 61 which is adapted to be rotatable and movable horizontally (i.e. in the X and Y directions) and vertically (i.e. in the Z direction). A stage controller 64 is provided for controlling the aforementioned movement of the stage 61. As shown in FIG. 3A, the measurement mark 63 includes a rectangular resist mark 63a that is formed on a rectangular underlying mark 63b formed at an end of each shot area of the wafer 62. The resist mark 63a is formed at the time when a predetermined resist pattern is formed on top of the underlying pattern on the wafer 62 by a photolithography process. The mark position detection apparatus according to this embodiment measures displacement in superposition of the resist mark 63 relative to the underlying mark 63b.

An illumination light flux composed of white light emitted from an illumination light source 11 is regulated in its diameter by an illumination aperture stop 12, then transmitted through a plane parallel plate 13 in the illumination optical system (which will be referred to as a first plane parallel plate 13 hereinafter) and then converged by a condenser lens 14 to illuminate a field stop 15 uniformly.

The field stop 15 has an opening S1 having a substantially rectangular shape as shown in the hatched illustration presented in FIG. 1. The opening S1 is arranged in an inclined manner at an angle of about 45 degrees with respect to both the X and Z axes as shown in FIG. 1 in an enlarged manner. The opening S1 is adapted to be shifted in the directions indicated by double sided arrows A and B in FIG. 1. In the illumination optical system 10, there is provided a mechanism (not shown) for adjusting the position (in the X and Z directions) of the illumination aperture stop 12.

The illumination light flux emergent from the field stop 15 is collimated by an illumination relay lens 16 to become a parallel light flux so as to enter a first beam splitter 17. The illumination light flux is reflected by the first beam splitter 17 in the −Z direction (i.e. the downward direction in FIG. 1) and converged by a first objective lens 18 to illuminate the measurement mark 63 of the wafer 62 placed on the stage 61 at a perpendicular illumination angle. In this way, the illumination optical system 10 is arranged in such a way that the inclination of the principal ray of the illumination light (i.e. the illumination telecentricity) is perpendicular to the wafer 62. The field stop 15 and the measurement mark 63 are arranged at positions conjugate to each other in the illumination optical system 10, so that the measurement mark 63 of the wafer 62 is illuminated by the illumination light with a rectangular area corresponding to the shape of the opening S1 of the aperture stop 15. In addition, a virtual pupil plane 19 of the first objective lens 18 is at the position conjugate with the illumination aperture stop 12.

In the imaging optical system 20, the reflected light L1 from the measurement mark 63 is collimated by the first objective lens 18, then transmitted through the first beam splitter 17, and converged onto a primary imaging plane 27 by a second objective lens 21 disposed above the first beam splitter 17. The light flux thus converged is partly transmitted and partly reflected by a second beam splitter 22 so as to be separated.

The transmitted light flux is transmitted through a first relay lens 23 and then through a plane parallel plate 24 in the imaging optical system (which plate will be referred to as a second plate parallel plate 24 hereinafter). Then, the diameter of the light flux is regulated by an imaging aperture stop 25 down to a predetermined diameter and an image of the measurement mark 63 is formed on a secondary imaging plane 28 by a second relay lens 26. An image pickup element (e.g. a CCD or the like) 31 of the image pickup apparatus 30 is disposed at the position equivalent to the secondary imaging plane so that an image of the measurement mark 63 is formed on the surface of the image pickup element 31. The output signal from the image pickup element 31 is processed by the image processing apparatus 40, so that detection of the position of the measurement mark 63 on the wafer 62, measurement of the superposition amount and observation on a television monitor can be performed. In addition, the virtual pupil plane 19 is at the position conjugate with the imaging aperture stop 25. This imaging optical system 20 is provided with mechanisms (not shown) for adjusting the position (in the X and Y directions) of the second objective lens 21 and the imaging aperture stop 24 respectively.

The light flux reflected to be separated by the second beam splitter 22 is collimated by a first relay lens 51 and then transmitted through a plane parallel plate 52, so that an image of the illumination aperture stop 12 is formed on a pupil splitting mirror 53.

The plane parallel plate 52 is provided for adjusting the position of the image of the illumination aperture stop 12 to the center of the pupil splitting mirror 53. The plane parallel plate 52 is constructed in such a way that it can be tilted. Light flux transmitted through the plane parallel plate 52 is split by the pupil splitting mirror 53 into two light fluxes. These light fluxes are focused with respect to the measurement direction at two positions on an AF sensor 56 by means of an AF second relay lens 54 through a cylindrical lens 55. The cylindrical lens 55 has a refracting power in the non-measurement direction, so that images of the light source are formed by the split two light fluxes on the AF sensor 56. The operation principle of auto focusing (AF) used in this system is well known (see, for example, Japanese Patent Application Laid-Open No. 2002-164266), and the description thereof will be omitted in this specification. The mark position detection apparatus according to this embodiment has the above-described structure.

In the mark position detection apparatus according to this embodiment, the first plane parallel plate 13 is provided in the path of a substantially parallel light flux in the illumination optical system 10, and the second plane parallel plate 24 is provided in the path of a substantially parallel light flux in the imaging optical system 20 so that the wavelength dependent difference of the measurement error TIS of the mark position detection apparatus can be adjusted to be minimized.

Next, the function of the first plane parallel plate 13 disposed in the illumination optical system 10 in the mark position detection apparatus according to this embodiment and how to adjust the first plane parallel plate 13 will be described in the following.

When the illumination optical system 10 and the imaging optical system 20 as shown in FIG. 1 are mounted, each optical member is secured by a metallic fixture and then that block is disposed parallel to the optical axis while using an instrument such as a collimator. However, each optical member has a tilt error corresponding to processing accuracy of the metallic block and an alignment error upon mounting. Especially, when an optical member disposed between the virtual pupil plane 19 in the vicinity of the exit pupil of the first objective lens 18 at the position conjugate with the illumination aperture stop 12 and the illumination aperture stop 12 has a tilt error, the position of the image of the illumination aperture stop 12 will be displaced in the X or Y direction depending on the color (or the wavelength) of the illumination light. This means that the illumination telecentricity of the illumination optical system 10 is displaced in the X or Y direction.

FIG. 2 shows an example of the situation in which the first beam splitter 17 has a tilt error. In such a case, even if the illumination telecentricity is perpendicular to the wafer surface 62 for the central wavelength of the illumination light, a light flux with a wavelength smaller than the central wavelength (for example, blue light LB) or a light flux with a wavelength larger than the central wavelength (for example, red light LR) will have illumination telecentricity that is inclined relative to the wafer surface 62. Consequently, the light flux with a smaller wavelength (LB) or the light flux with a larger wavelength (LR) will illuminate the measurement mark 63 from an oblique direction, and therefore the image signal profile of the image of the measurement mark 63 will be asymmetrical as shown in FIG. 3B.

In general, the structure and physical properties of the inner box 63a and the outer box 63b are different from each other. Therefore, it is considered that the wavelength characteristics of the reflectance at the edge portions of the measurement mark 63 will be different. Consequently, the characteristics of the image of the measurement mark 63 of each box 63a, 63b is determined by the illumination telecentricity at the wavelength range that corresponds with the reflectance characteristics of the measurement mark 63 of the corresponding box 63a, 63b. Therefore, a difference of the degree of influence of the inclination of illumination telecentricity between the inner box 63a and the outer box 63b can be a cause of the measurement error TIS.

Here, the measurement error TIS is defined as follows. Firstly, measurement of the measurement mark should be performed at two directions, namely, the 0 degree direction and the 180 degree direction. Then, the measurement error TIS is defined as the average of the superposition measurement value $L_0$ of the measurement mark 63 at the 0 degree direction and the superposition measurement value $L_{180}$ of the same measurement mark 63 at the 180 degree direction, namely the measurement error TIS is calculated by the following equation.

$$TIS=(L_0+L_{180})/2 \quad (1)$$

The measurement error TIS has been used as a measure for evaluating the performance of a mark position detection apparatus or a superposition measuring apparatus.

Therefore, if the image signal profile is distorted to be asymmetrical as shown in FIG. 3B, that asymmetry will cause the measurement error TIS to deteriorate the accuracy of mark position detection. Therefore, it is necessary to provide some measures for eliminating the difference in asymmetry that depends on the color (or the wavelength) of the illumination light.

In the following, the effect of the first plane parallel plate 13 provided in the illumination optical system 10 in relation to the color (or the wavelength) of light will be described with reference to FIGS. 4A and 4B.

In this embodiment, as shown in FIG. 1, the first plane parallel plate 13 is disposed between the illumination aperture stop 12 and the condenser lens 14 in the illumination optical system 10. The first plane parallel plate 13 can be tilted relative to the optical axis. Let us consider light fluxes having different wavelengths contained in the illumination light flux that have traveled on the same light path toward an image plane S as shown in FIGS. 4A and 4B. For example, the light fluxes having different wavelengths are blue light LB (shown by solid line in FIGS. 4A and 4B) and red light LR (shown by broken line). In the case that the first plane parallel plate 13 is inclined relative to the optical axis by an angle θ as shown in FIG. 4B, the light flux LB and the light flux LR travel along different light paths after the two light fluxes LB and Lr are transmitted through the first plane parallel plate 13 due to the prism effect, so that they are imaged at different positions on the image plane S. This is also the case with off-axis light fluxes LB' and LR'. In this way, the imaging position on the image plane S varies depending on the wavelength of the illumination light. The difference Δ between the imaging positions of the light fluxes LB and LR can be controlled by changing the inclination angle θ of the first plane parallel plate 13. Therefore, it is possible to correct displacement of the imaging position depending on the color (or the wavelength) of the illumination light by adjusting the inclination angle θ of the first plane parallel plate 13. In connection with this, the mechanism for adjusting the tilt of the first plane parallel plate 13 is a mechanism that can rotate it about axes parallel to the X axis and Z axis shown in FIG. 1 respectively.

In view of the above, it is possible to cancel a tilt error generated at the beam splitter 17 by tilting the first plane parallel plate 13 in an appropriate direction and by an appropriate angle for canceling the dispersion amount shown in FIG. 2 that is generated by the tilt error of the beam splitter. In this way, displacement of the position of the image of the illumination aperture stop 12 depending on the color (or the wavelength) of the illumination light can be eliminated, and the illumination telecentricity for the measurement mark 63 can be made substantially perpendicular all over the wavelength range of the illumination light. While the above description has been made with reference to the case in which the beam splitter 17 has a tilt error, the total tilt error of the illumination optical system 10 can be cancelled by tilting the plane parallel plate 13 in a similar manner even in the case that the condenser lens 14 and the illumination relay lens 16 have respective tilt errors.

Next, a specific way of adjusting the first plane parallel plate 13 will be described in the following. In connection with this, a measurement mark with which the measurement error TIS varies sensitively with variations in the illumination telecentricity is to be used.

In the first step, the measurement error TIS is measured under the state in which the wavelength range of the illumination light is limited to a shorter wavelength range (LB) by means of a wavelength limiting filter or the like. In the second step, the measurement error TIS is measured under the state in which the wavelength range of the illumination light is limited to a longer wavelength range (LR). In the third step, the first plane parallel plate 13 is tilted in the direction in which the difference in the measurement errors TIS measured in the first and second steps decreases. The above-described first to third steps are performed repeatedly until the difference in the measurement errors TIS becomes smaller than a predetermined standard value. The tilt position of the first plane parallel plate 13 is determined in this way. However, the way of adjusting the first plane parallel plate 13 is not limited to the above-described process, but it may be modified appropriately.

While the above description has been made with reference to the case that the first plane parallel plate 13 is disposed between the illumination aperture stop 12 and the condenser lens 14, the same effect can also be attained in the case that the plane parallel plate 13 is disposed between the relay lens 16 and the first beam splitter 17.

In the following, the function of the second plane parallel plate 24 disposed in the imaging optical system 20 of the mark position detection apparatus according to this embodiment and how to adjust the second plane parallel plate 24 will be described.

When the illumination optical system 10 and the imaging optical system 20 as shown in FIG. 1 are to be mounted, each optical member is secured by a metallic fixture and then that block is disposed parallel to the optical axis while using an instrument such as a collimator. However, each optical member has a tilt error corresponding to processing accuracy of the metallic block and an alignment error upon mounting. Especially, when an optical member disposed between the virtual pupil plane 19 in the vicinity of the exit pupil of the first objective lens 18 at the position conjugate with the imaging aperture stop 25 and the imaging aperture stop 25 has a tilt error, the position of the image of the virtual pupil plane 19 will be displaced in the X or Y direction depending on the color (or the wavelength) of the light reflected from the measurement mark 63.

FIG. 5 shows an example of the situation in which the first beam splitter 17 has a tilt error. In this case, with respect to, for example, the central wavelength light reflected from the measurement mark 63 of the wafer 62, the diffracted light is eclipsed by the imaging aperture stop 25 laterally symmetrically with respect to the optical axis (the state of eclipse is not shown in the drawings). However diffracted light with wavelengths in the range shorter than the central wavelength (LB1, LB2) or the diffracted light with wavelengths in the range longer than the central wavelength (LR1, LR2) will be eclipsed asymmetrically, and information on the diffracted light of the image of the measurement mark 63 formed on the image pickup element 31 will become non-uniform in a lateral direction. Consequently, as shown in FIG. 6A, the reflected light flux in the shorter wavelength range (LB) or in the longer wavelength range (LR) is in the state equivalent to the case in which the diffracted light is asymmetrical, so that the image signal profile of the image of the measurement mark formed on the image pickup element 31 becomes asymmetrical as shown in FIG. 6B.

In general, the structure and physical properties of the inner box 63a and the outer box 63b are different from each other. Therefore, it is considered that the wavelength characteristics of the reflectance at the edge portions of the measurement mark 63 will be different. Consequently, the characteristics of the image of the measurement mark 63 of each box is determined by the symmetry of the eclipse of diffraction light at the wavelength range that conforms with the reflectance characteristics of the measurement mark 63 of the corresponding box. Therefore, a difference in the eclipse of the diffracted light between the inner box 63a and the outer box 63b can be a cause of the measurement error TIS.

Therefore, if the image signal profile is distorted to be asymmetrical as shown in FIG. 6B, that asymmetry will cause the measurement error TIS to deteriorate the accuracy of mark position detection. Therefore, it is necessary to provide some measures for eliminating the difference in asymmetry that depends on the color (or the wavelength) of the illumination light.

In the following, the effect of the second plane parallel plate 24 provided in the imaging optical system 20 in relation to the color (or the wavelength) of light will be described with reference to FIGS. 4A and 4B.

Let us consider light fluxes having different wavelengths contained in the light reflected from the mark that have traveled on the same light path toward an image plane S as shown in FIGS. 4A and 4B. For example, the light fluxes having different wavelengths are blue light LB (shown by solid line) and red light LR (shown by broken line). In the case that the second plane parallel plate 24 is inclined relative to the optical axis by an angle θ as shown in FIG. 4B, the light flux LB and the light flux LR travel along different light paths after the two light fluxes LB and LR are transmitted through the second plane parallel plate 24 due to the prism effect, so that they are imaged at different positions on the image plane S. This is also the case with off-axis light fluxes LB' and LR'. In this way, the imaging position on the image plane S varies depending on the wavelength of the reflected light. The difference Δ between the imaging positions of the light fluxes LB and LR can be controlled by changing the inclination angle θ of the second plane parallel plate 24. Therefore, it is possible to correct displacement of the imaging position depending on the color (or the wavelength) of the reflected light by adjusting the inclination angle θ of the second plane parallel plate 24. In connection with this, the mechanism for adjusting the tilt of the second plane parallel plate 24 is a mechanism that can rotate it about axes parallel to the X axis and Z axis shown in FIG. 1 respectively.

In view of the above, it is possible to cancel a tilt error generated at the beam splitter 17 by tilting the second plane parallel plate 24 in an appropriate direction and by an appropriate angle for canceling the dispersion amount shown in FIG. 5 that is generated by the tilt error of the beam splitter 17. In this way, displacement of the position of the image of the virtual pupil plane 19 at the position of the imaging aperture stop 25 depending on the color (or the wavelength) of the reflected light can be eliminated, and the image of the pupil plane 19 can be formed at substantially the same position over a wide wavelength range. While the above description has been made with reference to the case in which the beam splitter 17 has a tilt error, the total tilt error of the illumination optical system 10 can be cancelled in a similar manner even in the case that 5 the second objective lens 21, the AF separating beam splitter 22 and the first relay lens 23 have respective tilt errors.

Next, the way of adjusting the imaging optical system 20 and the second plane parallel plate 24 will be described in the following. The adjustment is performed by a adjusting process making use of position adjustment of the imaging aperture stop 25 and the second objective lens 23. A wafer having an L/S (line and space) mark 70 as shown in FIG. 7A is placed on the stage 61 of the apparatus shown in FIG. 1 in place of the wafer 62, then the L/S mark 70 is illuminated by the illumination optical system 10, and then an image of L/S mark 70 picked up by the image pickup element 31 is subjected to image processing. The L/S mark 70 is composed of a plurality of linear mark elements 71 to 77 extending parallel to each other at a pitch of 6 μm each of which has a width of 3 μm and a step difference of 0.08 μm (equal to one-eighth of the wavelength λ of the illumination light) as shown in FIGS. 7A and 7B.

An image of the L/S mark obtained by the image pickup element 31 is processed by the image processing apparatus 40. The profile of the image signal intensity thus obtained is as shown in FIG. 7C. The signal intensity decreases at the position corresponding to both stepped edges of each of the linear mark elements 71 to 77. Thus, the signal intensity differences ΔI at the stepped positions at both edges of the linear mark elements are obtained, and the Q value representing asymmetry of the L/S mark image is calculated as the average of the signal intensity differences ΔI for all of the linear mark elements 71 to 77 (Q=1/7×Σ(ΔI/I)×100(%)). Then, the stage 61 is moved in the vertical direction (i.e. the Z direction) to move the L/S mark 70 in the Z direction, and the Q value for every vertical position (i.e. the position with respect to the Z direction) is determined. Thus, the focus characteristics of the Q value is obtained. For example, the Q value characteristics curve shown in FIGS. 8A to 8C is obtained.

FIG. 8A shows a component that is varied by adjustment of the imaging aperture stop 25, that is, a concave or convex component. FIG. 8B shows a component that is varied by shift adjustment of the second objective lens 21, that is, a slope component of the Q value characteristics curve. Under the state in which each element is mounted in accordance with the mechanical design values, each element is in a largely displaced position, and therefore the Q value characteristics curve is in a state like shown in FIG. 8C. Under that state, the adjustment is performed first on the imaging aperture stop, which has a high adjustment sensitivity. Next, the second objective lens 21 is adjusted. If the concave or convex component of the Q value characteristics curve is large, it is difficult to determine the adjustment value of the second objective lens 21 appropriately. For this reason, it is desirable that the adjustment is performed in the above-described order. If the focus characteristics curve of the Q value does not comes within the range of a certain qualitative standard by one adjustment process, adjustment should be performed repeatedly until it comes within that range.

The Q value characteristics curve shown in FIG. 8A to 8C is measured for each wavelength and the tilt adjustment of the second plane parallel plate 24 is performed using a difference in the concave or convex component in the Q value characteristics curve shown in FIG. 8A as an index. In the first step, the Q value characteristics curve is measured under the state in which the wavelength range of the illumination light is limited to a shorter wavelength range (LB) by means of a wavelength limiting filter or the like. In the second step, the Q value characteristics curve is measured under the state in which the wavelength range of the illumination light is limited to a longer wavelength range (LR). In the third step, the second plane parallel plate 24 is tilted in the direction in which the difference in the concave or convex components in the Q value characteristics curves measured in the first and second steps decreases. The above-described first to third steps are performed repeatedly until the difference in the concave or convex components in the Q value characteristics curves becomes smaller than a predetermined standard value. It should be understood that the way of adjusting the second plane parallel plate 24 is not limited to the above-described process.

As per the above, according to the mark position detection apparatus according to this embodiment, the illumination telecentricity in the illumination optical system is made perpendicular to the wafer irrespective of the wavelength range, so that it is possible to avoid generation of a measurement error TIS that depends on reflection spectral characteristics of the mark to be detected. In addition, in the imaging optical system, eclipse of the diffracted light is adjusted to be symmetrical with respect to the optical axis over the whole wavelength range, so that it is possible to avoid generation of a measurement error TIS that depends on reflection spectral characteristics of the mark to be detected. Consequently, it is possible to improve measurement accuracy of the superposition measurement apparatus and the mark position detection apparatus.

As per the above, according to the first embodiment, the measurement error TIS can be reduced irrespective of the color (or the wavelength), and it is possible to provide a mark position detection apparatus that can detect the mark position with high accuracy.

Next, second to fourth embodiments of the present invention will be described with reference to the drawings.

The basic structure of the mark position detection apparatus according to the following second to fourth embodiments of the present invention is the same as the structure shown in FIG. 1. In addition, the diagram of FIG. 2 showing an example of illumination telecentricity displacement caused by a tilt error of an optical element in an illumination optical system and FIGS. 3A to 3C and 4A to 4C can be applied also to the second to fourth embodiments. Hence similar illustrations and redundant descriptions will be omitted.

Figure 9A:
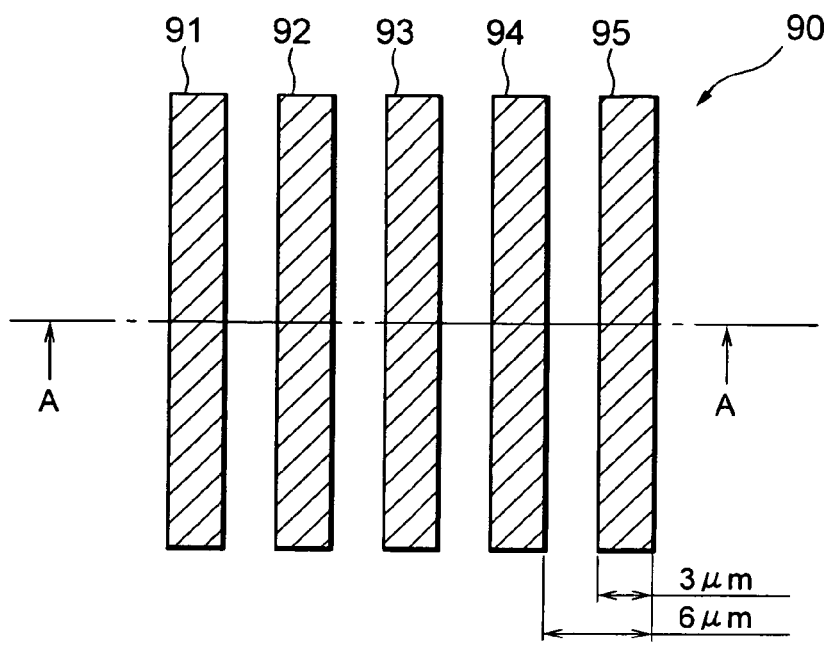
Figure 9B:
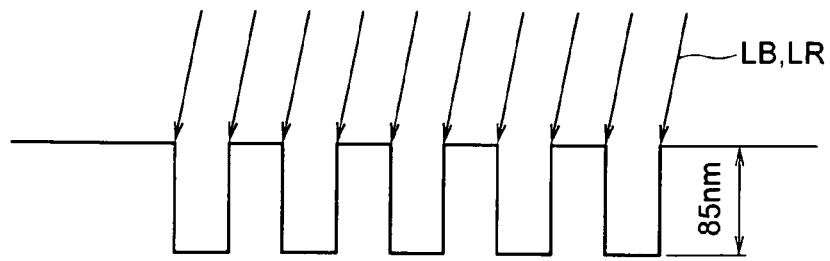
Figure 9C:
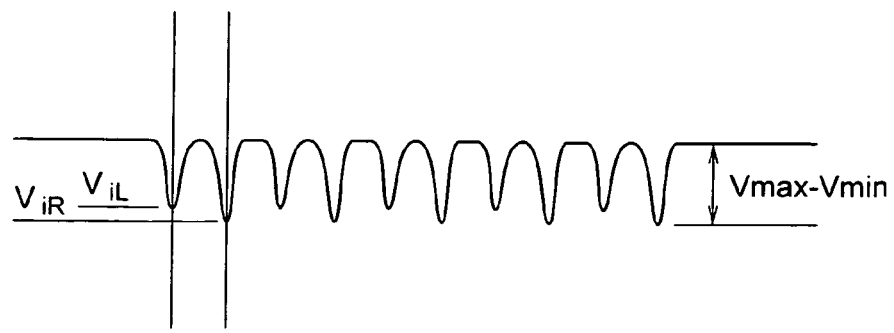
Figure 10A:
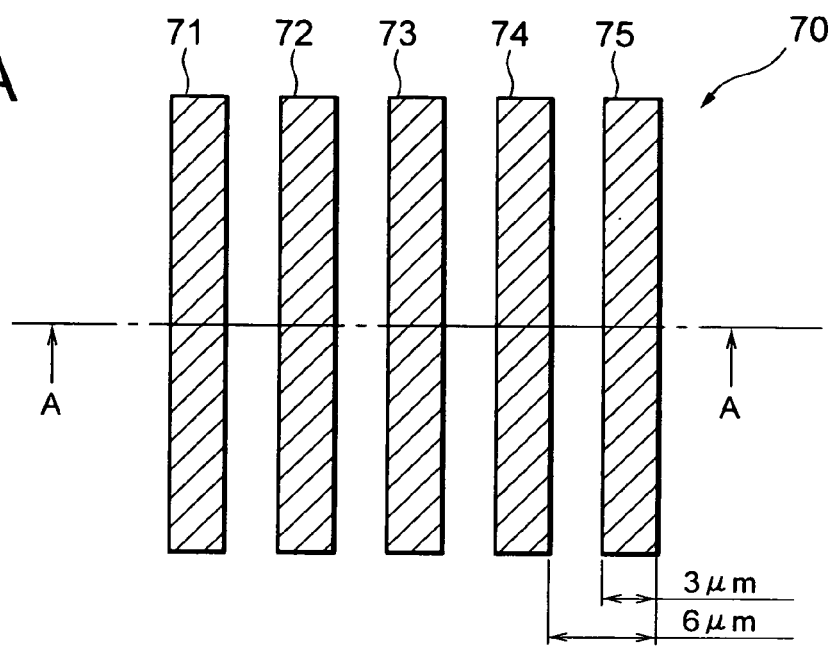
Figure 10B:
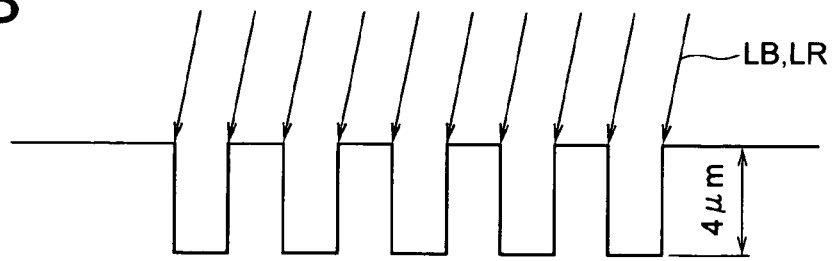
Figure 10C:
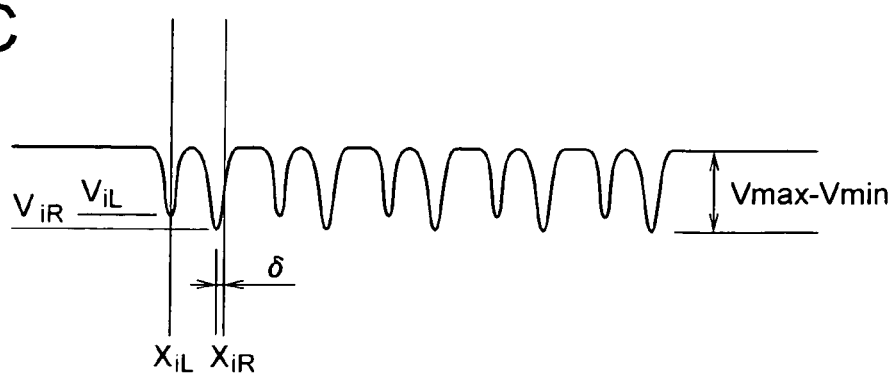
Figure 11A:
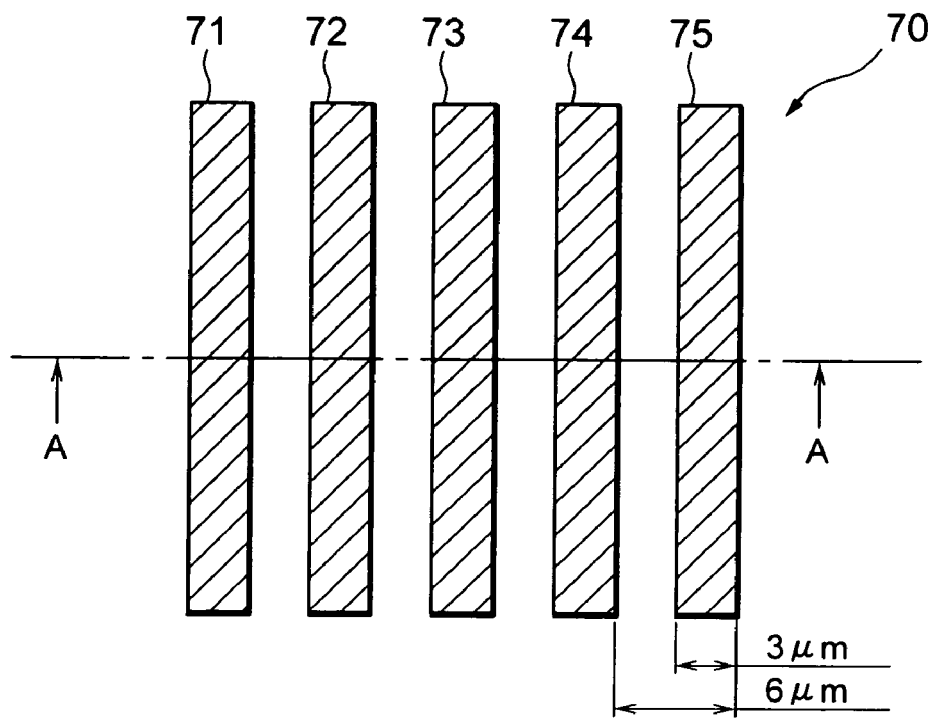
Figure 11B:
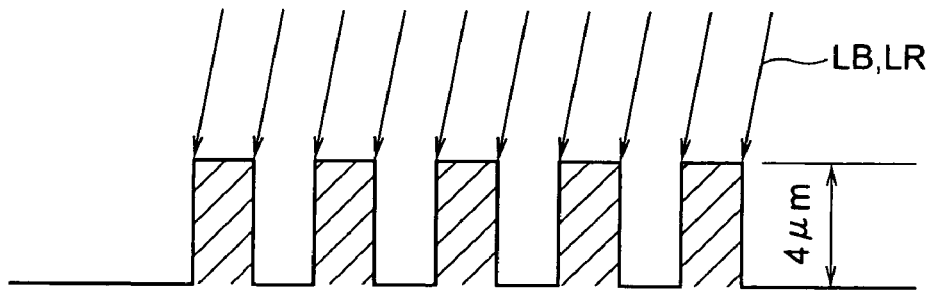

FIGS. 9A-9C, 10A-10C and 11A-11C show measurement marks used in adjustment processes according to the second to fourth embodiments respectively. FIGS. 9A, 10A and 11A are plan views, FIGS. 9B, 10B and 11B are cross sectional views taken along lines A-A in FIGS. 9A, 10A and 11A respectively, and FIGS. 9C, 10C and 11C show examples of processed image signals obtained from the respective measurement marks.

Second Embodiment

FIGS. 9A shows a measurement mark used in an adjustment process according to the second embodiment of the present invention. FIG. 9A is a plan view, FIG. 9B is a cross sectional view taken along line A-A in FIG. 9A and FIG. 9C shows an example of a processed image signal obtained from the measurement mark. In this process, a measurement mark with which the measurement error TIS varies sensitively with variations in the illumination telecentricity is used.

A wafer having an L/S (line and space) mark 90 as shown in FIG. 9A is placed on the stage 61 of the apparatus shown in FIG. 1 in place of the wafer 62, then the L/S mark 90 is illuminated by the illumination optical system 10, and an image of L/S mark 90 picked up by the image pickup element 31 is subjected to image processing. The L/S mark 90 is composed of a plurality of linear mark elements 91 to 95 extending parallel to each other at a pitch of 6 μm each of which has a width of 3 μm and a step difference of 85 nm as shown in FIGS. 9A and 9B.

An image of the L/S mark obtained by the image pickup element 31 is processed by the image processing apparatus 40. The profile of the image signal intensity thus obtained is as shown in FIG. 9C.

In this method, a plurality of wavelength limiting filters are prepared. They are inserted into the illumination optical path, so that processed image signals corresponding to them are obtained from respective optical images. For example, two band-pass filters for the shorter wavelength range (LB) and for the longer wavelength range (LR) are inserted into the illumination optical path, and a processed image signal as shown in FIG. 9C is obtained. Then, an optical characteristic value β is calculated based on the following equation (2):

$$\beta = \Sigma((V_{iL} - V_{iR})/(V_{max} - V_{min}))/n \quad (2)$$

where, n is the number of the edge pairs, i is a suffix for designating each edge, and $V_{iL}$ and $V_{iR}$ designate the intensities at the bottom of the left and right edges respectively. Thus, several values of β are obtained while varying defocus amount Z. In a "β to Z" curve drawn based on the obtained values, the offset amounts B(LB) and B(LR) correspond to the illumination telecentricities at the shorter wavelength range and the longer wavelength range respectively.

Therefore, the inclination of the plane parallel plate 13 in the illumination optical system 10 may be adjusted in such a way that the difference between the offset amount B(LB) and the offset amount B(LR) approaches to zero.

In the case that adjustment is performed using more than two wavelength ranges, the inclination angle of the plane parallel plate 13 may be adjusted in such a way that the variation (typically, the standard deviation) of the β offset amounts is made minimum.

Third Embodiment

In the following, a process of adjusting a microscope according to a third embodiment of the present invention will be described.

FIG. 10A shows a measurement mark used in the adjusting process according to the third embodiment. The adjustment process of the third embodiment is a modification of the adjusting method according to the second embodiment. FIG. 10A is a plan view like FIG. 9A, FIG. 10B is a cross sectional view taken along line A-A in FIG. 10A and FIG. 10C shows an example of a processed image signal obtained from the measurement mark.

An image of an L/S (line and space) mark 70 as shown in FIG. 10A is picked up and a processed image signal is obtained in the same manner as the second embodiment.

The L/S mark 70 is composed of a plurality of linear mark elements 71 to 75 extending parallel to each other at a pitch of 6 μm each of which has a width of 3 μm and a step difference of 4 μm (this step difference is equal to 2 to 6 times the focal length of the mark detection apparatus).

In this embodiment, the coordinate position of the extreme value of each edge of the cross sectional profile is read from the profile shown in FIG. 10C. In this embodiment, the step difference of the measurement mark 70 is relatively large as compared to that in the second embodiment (shown in FIG. 9A). Consequently, the shaded side edge portion of the profile is extended in accordance with the illumination telecentricity, so that the position of the extreme value is shifted toward the shaded side. Adjustment is performed making use of this fact.

Letting $X_{iL}$ and $X_{iR}$ be the coordinates of the edges as shown in FIG. 10C, the shift amount of the coordinates due to the illumination telecentricity is given by the following formula (3).

$$((X_{(i+1)L} - X_{iR}) - (X_{iR} - X_{iL})) \quad (3)$$

This formula provides the value 2δ (δ is the standard deviation). Therefore, the inclination angle of the plane parallel plate 13 in the illumination optical system is adjusted in such a way that the variation of the coordinate positions at the LB side and LR side becomes small (namely, the value of δ becomes small).

Although the descriptions of the second and third embodiments have been made with reference to the case in which the L/S pattern is formed as an indented pattern, it is apparent that a similar adjustment process is also made possible by using a mark including an projecting L/S pattern formed on a substrate as shown in FIGS. 11A and 11B. In that case, the height of the pattern should be equal to two to six times the wavelength of the mark detection apparatus.

Fourth Embodiment

Figure 12A:
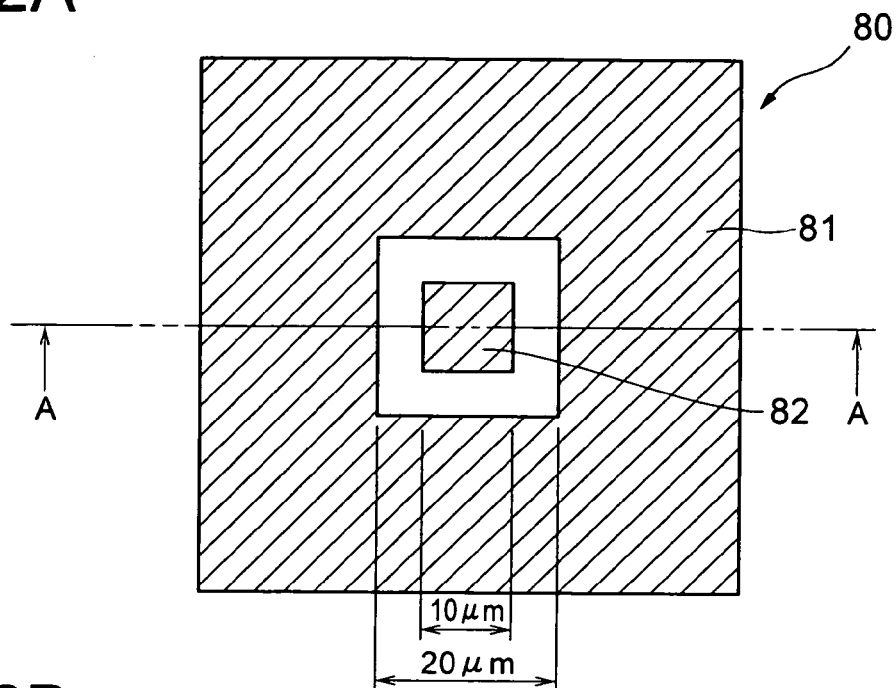
Figure 12B:
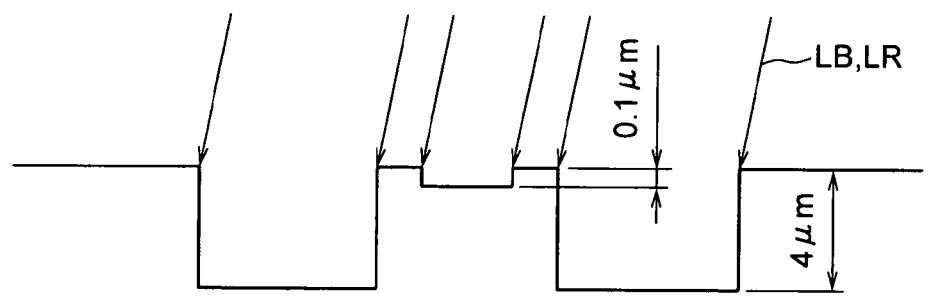
Figure 12C:
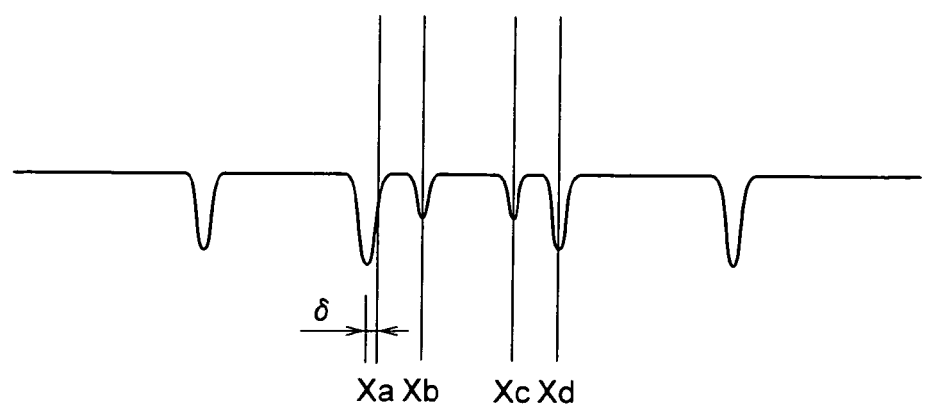

In the following, a process of adjusting a microscope according to a fourth embodiment of the present invention will be described with reference to FIGS. 12A to 12C. FIGS. 12A to 12C show a measurement mark used in the adjustment process according to the fourth embodiment. FIG. 12A is a plan view, FIG. 12B is a cross sectional view taken along line A-A in FIG. 12A, and FIG. 12C shows an example of a processed image signal obtained from the measurement mark. In this process, a measurement mark with which the measurement error TIS varies sensitively with variations in the illumination telecentricity is used.

A wafer having a box-in-box mark 80 as shown in FIG. 12A is placed on the stage 61 of the apparatus shown in FIG. 1 in place of the wafer 62, then the box-in-box mark 80 is illuminated by the illumination optical system 10, and then an image of the box-in-box mark picked up by the image pickup element 31 is subjected to image processing. The box-in-box mark 80 is composed of a large rectangle 81 and a small rectangle 82 that is disposed concentrically inside the large rectangle 81. The large rectangle 81 is indented as deep as 4 μm (this depth or step difference is equal to 2 to 6 times the focal length of the mark detection apparatus), while the small rectangle 82 is indented with a depth of 0.1 μm. The small rectangle 82 is square with a side length of 10 μm, and a non-indented area with a width of 5 μm is left around the small rectangle 82 so that the small rectangle 82 is separated from the large rectangle 81.

An image of the box-in-box mark obtained by the image pickup element 31 is processed by the image processing apparatus 40. The profile of the image signal intensity thus obtained is as shown in FIG. 12C.

With this box-in-box mark, the superposition displacement amount ΔX is defined by the following formula (4), $$\Delta X = (Xa - Xb - Xc + Xd)/2 \quad (4)$$

where Xa and Xd represent coordinate positions from the edge of the large rectangle 81 and Xb and Xc represents coordinate positions from the edge of the small rectangle 82.

The superposition displacement amount α'X under a state in which the illumination telecentricity is inclined from the ideal state is represented by the following formula (5).

$$\Delta' X = (Xa - Xb - Xc + Xd - \delta)/2 = \Delta X - \delta/2 \quad (5)$$

When the same mark is rotated by 180 degrees and measurement is performed on that mark, the superposition displacement amount is represented by the following formula (6).

$$\Delta' X(-) = ((-Xa) - \delta - )(-Xb) - (-Xc) + (-Xd))/2 = -\Delta X - \delta/2 \quad (6)$$

Consequently, the TIS value is represented as follows based on the formulas (5) and (6).

$$TIS = (\Delta' X + \Delta' X(-))/2 = \delta/2$$

This value will be an index representing illumination telecentricity.

The TIS value is measured in plurality of wavelength ranges, and the inclination angle of the plane parallel plate 13 of the illumination optical system is adjusted in such a way that the variation of the TIS value with the variation in the illumination wavelength becomes small.

As per the above, according to this embodiment, it is possible to provide effective optical element adjusting means for controlling wavelength dependency of the illumination telecentricity in a microscope apparatus. Thus, when it is applied to a measurement microscope or an inspection apparatus, measurement independent from a sample to be measured having optical characteristics can be made possible.

The effects same as the above-described embodiments can also be realized by performing similar adjustment on the plane parallel plate 24 provided in the imaging optical system.

It should be noted that the above embodiments have been described by way of example and the invention is not limited to the specific structures or forms that have been described above, but they can be modified or changed in various ways within the scope of the present invention.

What is claimed is:

1. A method for minimizing wavelength dependent error in a mark position detection apparatus, comprising:
    illuminating a mark using an illumination optical system, comprising:
        producing as plurality of light fluxes having a plurality of wavelengths from a light source,
        transmitting the plurality of light fluxes through a first optical element, and
        adjusting the first optical element relative to a first optical axis in the illumination optical system in accordance with a wavelength range,
        wherein said first optical element suppresses a tool induced shift (TIS) value of the mark position detection apparatus caused by telecentricity of the illumination optical system; and
    collecting and focusing reflected light from a mark to form an image using an imaging optical system,
    wherein adjusting the first optical element comprises:
        (a) measuring a first measurement error at a first range of wavelengths;
        (b) measuring a second measurement error at a second range of wavelengths, wherein the second range of wavelengths is longer than the first range of wavelengths;
        (c) calculating a difference between the first measurement error and the second measurement error;
        (d) tilting the first optical element in a direction in which the difference decreases; and
        (e) repeating steps (a) through (d) until the difference reaches a predetermined value.

2. The method of claim 1, wherein the adjusting the first optical element relatively aligns optical paths of different wavelengths.

3. A method for minimizing wavelength dependent error in a mark position detection apparatus, comprising:
    illuminating a mark using an illumination optical system, comprising:
        producing a plurality of light fluxes having a plurality of wavelengths from a light source,
        transmitting the plurality of light fluxes through a first optical element, and
        adjusting the first optical element relative to a first optical axis in the illumination optical system in accordance with a wavelength range,
        wherein said first optical element suppresses a tool induced shift (TIS) value of the mark position detection apparatus caused by telecentricity of the illumination optical system;
    collecting and focusing reflected light from a mark to form an image using an imaging optical system,
    providing a second optical element in a path that is substantially parallel to light fluxes in the reflected light; and
    adjusting the second optical element in accordance with a wavelength range of the reflected light,
    wherein adjusting the second optical element comprises:
        (a) calculating a value representing asymmetry of the image;
        (b) generating a characteristic curve for the value, the characteristic curve having a concave component or a convex component;
        (c) measuring the characteristic curve at a first wavelength range;
        (d) measuring the characteristic curve at a second wavelength range, the second wavelength range being longer than the first wavelength range;
        (e) calculating a difference between a first concave component or a first convex component at said first wavelength range and a second concave component or a second convex component at said second wavelength range;
        (f) tilting the second optical element in a direction in which the difference decreases;
        (g) repeating steps (c) through (f) until the difference reaches a predetermined value.

4. The method according to claim 3, wherein the mark comprises a periodic structure of linear elements, the method further comprising calculating the value by averaging imaging signal intensity differences for all of the linear elements.

5. The method of claim 3, wherein the adjusting the first optical element relatively aligns optical paths of different wavelengths.

6. A method for minimizing wavelength dependent error in a mark position detection apparatus, comprising:
- illuminating a mark using an illumination optical system, comprising:
  - producing a plurality of light fluxes having a plurality of wavelengths from a light source,
  - transmitting the plurality of light fluxes through a first optical element, and
  - adjusting the first optical element relative to a first optical axis in the illumination optical system in accordance with a wavelength range,
  - wherein said first optical element suppresses a tool induced shift (TIS) value of the mark position detection apparatus caused by telecentricity of the illumination optical system; and
- collecting and focusing reflected light from a mark to form an image using an imaging optical system,
- wherein the mark comprises a plurality of periodic lines and spaces, the method further comprising:
- generating a profile from the mark;
- providing a plurality of wavelength limiting filters in an illumination optical path;
- calculating an optical characteristic value from intensity values of the image;
- calculating offset values from the profile and the optical characteristic value; and
- adjusting the first optical element to minimize the offset values.

7. The method of claim 6, wherein the adjusting the first optical element relatively aligns optical paths of different wavelengths.

8. A method for minimizing wavelength dependent error in a mark position detection apparatus, comprising:
- illuminating a mark using an illumination optical system, comprising:
  - producing a plurality of light fluxes having a plurality of wavelengths from a light source,
  - transmitting the plurality of light fluxes through a first optical element, and
  - adjusting the first optical element relative to a first optical axis in the illumination optical system in accordance with a wavelength range,
  - wherein said first optical element suppresses a tool induced shift (TIS) value of the mark position detection apparatus caused by telecentricity of the illumination optical system; and
- collecting and focusing reflected light from a mark to form an image using an imaging optical system,
- wherein the mark comprises a plurality of periodic lines and spaces, the method further comprising:
- reading a coordinate position of an extreme value of each edge of lines and spaces of the mark;
- measuring a coordinate position of the extreme value of each edge at a short wavelength range;
- measuring a coordinate position of the extreme value of each edge at a long wavelength range;
- adjusting an inclination angle of the first optical element such that a variation of the coordinate positions at the short wavelength range and the long wavelength range decreases to a predetermined value.

9. The method of claim 8, wherein the adjusting the first optical element relatively aligns optical paths of different wavelengths.

* * * * *